(12) United States Patent
Strode

(10) Patent No.: US 8,441,386 B2
(45) Date of Patent: May 14, 2013

(54) METHOD TO REDUCE VOLTAGE SWING AT COMPARATOR INPUT OF SUCCESSIVE-APPROXIMATIONS-REGISTER ANALOG-TO-DIGITAL CONVERTERS

(75) Inventor: Jonathan Ronald Francis Strode, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 107 days.

(21) Appl. No.: 13/085,920

(22) Filed: Apr. 13, 2011

(65) Prior Publication Data

US 2012/0262316 A1    Oct. 18, 2012

(51) Int. Cl.
*H03M 1/34*    (2006.01)

(52) U.S. Cl.
USPC ........... 341/162; 708/300; 708/313; 331/173; 330/9; 327/382; 327/427; 327/551; 327/554

(58) Field of Classification Search .......... 341/140–160; 708/300, 313; 331/173; 330/9; 327/427, 327/551, 554, 382
See application file for complete search history.

(56) References Cited

U.S. PATENT DOCUMENTS

| | | | | |
|---|---|---|---|---|
| 5,724,000 A | * | 3/1998 | Quinn | 327/554 |
| 6,144,331 A | * | 11/2000 | Jiang | 341/172 |
| 6,448,321 B1 | * | 9/2002 | Tokita | 524/394 |
| 6,894,627 B2 | * | 5/2005 | Janakiraman et al. | 341/102 |
| 7,511,648 B2 | * | 3/2009 | Trifonov et al. | 341/143 |
| 7,705,755 B2 | * | 4/2010 | Yang et al. | 341/120 |
| 8,031,099 B2 | * | 10/2011 | Zhao et al. | 341/150 |
| 8,049,654 B2 | * | 11/2011 | Reinhold et al. | 341/172 |

* cited by examiner

*Primary Examiner* — Lam T Mai

(57) ABSTRACT

A SAR ADC includes a DAC including a first set of capacitors each having a first end connected to a common node, and a second end, and a first set of switches each connecting the second end of a respective one of the capacitors to a first reference voltage. The SAR ADC further includes a second set of capacitors each having a first end connected to the common node and a second end that receives an input to be converted when the common node is connected to ground. The SAR ADC further includes a second set of switches that selectively connect the second end of a first capacitor of the second set of capacitors to ground when the input is disconnected from the second ends of the second set of capacitors and when the common node is disconnected from ground during a first of a plurality of successive approximations.

12 Claims, 11 Drawing Sheets

US 8,441,386 B2

METHOD TO REDUCE VOLTAGE SWING AT COMPARATOR INPUT OF SUCCESSIVE-APPROXIMATIONS-REGISTER ANALOG-TO-DIGITAL CONVERTERS

FIELD

The present disclosure relates generally to analog-to-digital converters and more particularly to reducing voltage swing at comparator input of successive-approximations-register analog-to-digital converters (SAR ADCs).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIGS. 1A and 1B, a successive-approximations-register analog-to-digital converter (SAR ADC) 100 is shown. In FIG. 1A, the SAR ADC 100 includes a sample-and-hold circuit 102, a SAR module 104, a digital-to-analog (DAC) converter 106, and a comparator 108. The sample-and-hold circuit 102 receives an analog input signal to be converted and outputs an input voltage $V_{IN}$ to the comparator 108.

The SAR module 104 includes an N-bit register to implement a binary search algorithm to convert the analog input signal. The N-bit register is initially set to a midscale value, for example, to 100 . . . 00, where the most significant bit (MSB) is set to 1. The SAR module 104 outputs the midscale value stored in the N-bit register to the DAC 106. The DAC 106 converts the N-bit input received from the SAR module 104 and outputs a voltage $V_{DAC}$ to the comparator 108. Since the N-bit input is 100 . . . 00, $V_{DAC}=V_{REF}/2$, where $V_{REF}$ is the reference voltage provided to the SAR ADC 100.

The comparator 108 compares $V_{IN}$ to $V_{DAC}$ and determines if $V_{IN}$ is less than $V_{DAC}$ or greater than $V_{DAC}$. If $V_{IN}$ is greater than $V_{DAC}$, the output of the comparator 108 is a logic high, or 1, and the MSB of the N-bit register remains at 1. Conversely, if $V_{IN}$ is less than $V_{DAC}$, the output of the comparator 108 is a logic low, or 0, and the MSB of the register is cleared to logic 0. This step is generally referred to as MSB testing.

The SAR module 104 then moves to the next bit and forces that bit high. The comparator 108 performs another comparison. The process continues to the least significant bit (LSB), which concludes the conversion process. When the conversion is complete, an N-bit digital word is output from the N-bit register. The N-bit word is a digital representation of the analog input. This process of converting an along signal using the SAR module 104, the DAC 106, and the comparator 108 is called the binary search algorithm.

In FIG. 1B, an example of a 4-bit conversion using the binary search algorithm is shown (i.e., N=4). In the example, the DAC 106 initially receives $1000_2$ from a 4-bit register in the SAR module 104. That is, bit 3, the MSB, of the 4-bit register is set to 1. A first comparison shows, for example, that $V_{IN}<V_{DAC}$. Therefore, bit 3 of the 4-bit register is reset to 0. The DAC 106 then receives $0100_2$, and a second comparison is performed. If $V_{IN}>V_{DAC}$, for example, bit 2 of the 4-bit register remains at 1. The DAC 106 then receives $0110_2$, and a third comparison is performed. Bit 1 is reset to 0 if $V_{IN}<V_{DAC}$, for example, and the DAC 106 then receives $0101_2$ for a final comparison. Finally, bit 0 remains at 1 if, for example, $V_{IN}>V_{DAC}$. Thus, a 4-bit word 0101 is output from the 4-bit register, which is a digital representation of the analog input.

The sample-and-hold circuit 102 shown in FIG. 1A can be embedded in the DAC 106. Many SAR ADCs use a capacitive DAC that provides an inherent sample-and-hold function. A capacitive DAC includes an array of N capacitors with binary-weighted values and one dummy LSB capacitor Referring now to FIG. 2, an example of a 16-bit capacitive DAC 200 connected to a comparator 202 is shown. The DAC 200 includes an array of capacitors having binary weighted values. One end of each capacitor is connected to a common terminal. The other end of each capacitor is connected to a switch. The switch connected to each capacitor, except the dummy capacitor, connects the capacitor to the analog input signal ($V_{IN}$), a reference voltage ($V_{REF}$), or ground (GND) depending on control signals received from the SAR module 104 shown in FIG. 1. The switch connected to the dummy capacitor connects the dummy capacitor to $V_{IN}$ or ground. A switch selectively connects the common terminal to ground. The common terminal is connected to a first input of the comparator 202. A second input of the comparator 202 is connected to ground.

During acquisition phase, the common terminal of capacitors is connected to ground, and the other terminals of the capacitors are connected to the analog input signal ($V_{IN}$). After acquisition, the common terminal is disconnected from ground, and the other terminals of the capacitors are disconnected from $V_{IN}$. Effectively, a charge proportional to the input voltage is trapped on the capacitors. The other terminals of the capacitors are then connected to ground, driving the common terminal negative to a voltage equal to $-V_{IN}$.

As a first step in the binary search algorithm, a bottom plate of the MSB capacitor is disconnected from ground and connected to $V_{REF}$. This drives the common terminal in the positive direction by an amount equal to $½V_{REF}$. Therefore, $V_{COMMON}=-V_{IN}+½\times V_{REF}$. The output of the comparator 202 is logic 1 if $V_{COMMON}<0$ (i.e., $V_{IN}>½\times V_{REF}$). The output of the comparator 202 is logic 0 if $V_{IN}<½\times V_{REF}$. If the comparator output is logic 1, then the bottom plate of the MSB capacitor stays connected to $V_{REF}$. Otherwise the bottom plate of the MSB capacitor is connected back to ground. The bottom plate of the next smaller capacitor is then connected to $V_{REF}$, and a new $V_{COMMON}$ voltage is compared to ground. This process continues until all the bits have been determined. In general, $V_{COMMON}=-V_{IN}+(B_{N-1}\times V_{REF}/2)+(B_{N-2}\times V_{REF}/4)+(B_{N-1}\times V_{REF}/8)+ \ldots +(B0\times V_{REF}/2^{N-1}$ (B_ comparator output/ADC output bits)).

SUMMARY

A successive-approximations-register analog-to-digital converter (SAR ADC) comprises a digital-to-analog converter (DAC) including a first set of capacitors each having a first end connected to a common node, and a second end, and a first set of switches each connecting the second end of a respective one of the capacitors to a first reference voltage of the SAR ADC. The SAR ADC further comprises a second set of capacitors each having a first end connected to the common node and a second end that receives an input to be converted by the SAR ADC when the common node is connected to a reference voltage. The SAR ADC further comprises a second set of switches that selectively connect the second end of a first capacitor of the second set of capacitors to the reference voltage when the input is disconnected from the second ends of the second set of capacitors and when the common node is disconnected from the reference voltage during a first of a plurality of successive approximations.

In other features, capacitances of the first set of capacitors are binary-weighted, and the SAR ADC further comprises a SAR module that switches connection of the second end of a second capacitor of the first set of capacitors from the first reference voltage to a second reference voltage of the SAR ADC during the first of the successive approximations. A capacitance of the second capacitor is less than a highest and greater than a lowest of the binary-weighted capacitances. The SAR ADC further comprises a comparator having a first input connected to the common node, a second input connected to the reference voltage, and an output.

In other features, the SAR module sets the output of the comparator as a most significant bit of a digital value of the input, connects the second ends of the second set of capacitors to the reference voltage, and generates remaining bits of the digital value of the input by performing additional successive approximations.

In other features, capacitances of the first and second sets of capacitors are binary-weighted, and the first capacitor of the second set of capacitors has a lowest of the binary-weighted capacitances in the second set of capacitors.

In still other features, a successive-approximations-register analog-to-digital converter (SAR ADC) comprises a digital-to-analog converter (DAC). The DAC includes a first set of capacitors each having a first end connected to a first input of a comparator of the SAR ADC, and a second end. The DAC further includes a first set of switches each connecting the second end of a respective one of the capacitors to a first reference voltage of the SAR ADC. The DAC further includes a second set of capacitors each having a first end connected to a second input of the comparator, and a second end. The DAC further includes a second set of switches each connecting the second end of a respective one of the capacitors of the second set of capacitors to the first reference voltage. The SAR ADC further comprises first, second, third, and fourth capacitors each having first ends that receive an input to be converted by the SAR ADC when the first and second inputs of the comparator are connected to a reference voltage, and second ends. The second ends of the first and second capacitors are connected to the first input of the comparator and the second ends of the third and fourth capacitors are connected to the second input of the comparator. The SAR ADC further comprises a third set of switches that selectively connect the first end of the first capacitor to the first end of the third capacitor when the input is disconnected from the first ends of the first, second, third, and fourth capacitors and when the first and second inputs of the comparator are disconnected from the reference voltage during a first of a plurality of successive approximations.

In other features, capacitances of the first and second sets of capacitors are binary-weighted, and the SAR ADC further comprises a SAR module that switches connections of the second ends of (i) a fifth capacitor of the first set of capacitors and (ii) a sixth capacitor of the second set of capacitors from the first reference voltage to a second reference voltage of the SAR ADC during the first of the successive approximations. A capacitance of the fifth and sixth capacitors is less than a highest and greater than a lowest of the binary-weighted capacitances. The SAR ADC further comprises the comparator that generates an output during the first of the successive approximations.

In other features, the SAR module sets the output of the comparator as a most significant bit of a digital value of the input, connects the first end of the second capacitor to the first end of the fourth capacitor, and generates remaining bits of the digital value of the input by performing additional successive approximations.

In other features, capacitances of the first and second sets of capacitors and capacitances the first, second, third, and fourth capacitors are binary-weighted.

In other features, the first and third capacitors have a first capacitance, the second and fourth capacitors have a second capacitance, and the first capacitance is less than or equal to the second capacitance.

In still other features, a successive-approximations-register analog-to-digital converter (SAR ADC) comprises a digital-to-analog converter (DAC) including a plurality of capacitors having binary-weighted capacitances, each having a first end connected to a common node, and a second end, a plurality of switches each connected to the second end of a respective one of the capacitors. The SAR ADC further comprises a SAR module that generates control signals to control the switches. Based on the control signals, the switches initially connect the second ends of the capacitors to an input to be converted by the SAR ADC when the common node is connected to a reference voltage. Then, during a first of a plurality of successive approximations, the switches disconnect the second ends of the capacitors from the input, disconnect the common node from the reference voltage, and connect the second end of one of the capacitors to a reference voltage of the SAR ADC. A capacitance of the one of the capacitors is less than a highest and greater than a lowest of the binary-weighted capacitances. A comparator having a first input connected to the common node and a second input connected to the reference voltage. The comparator generates an output during the first of the successive approximations.

In other features, the SAR module sets the output of the comparator as a most significant bit of a digital value of the input and generates remaining bits of the digital value of the input by performing additional successive approximations.

In other features, the SAR ADC further comprises a capacitor having a first end connected to the common node and a second end connected to the reference voltage, wherein a value of the capacitor is a predetermined fraction of a sum of the binary-weighted capacitances.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1A:
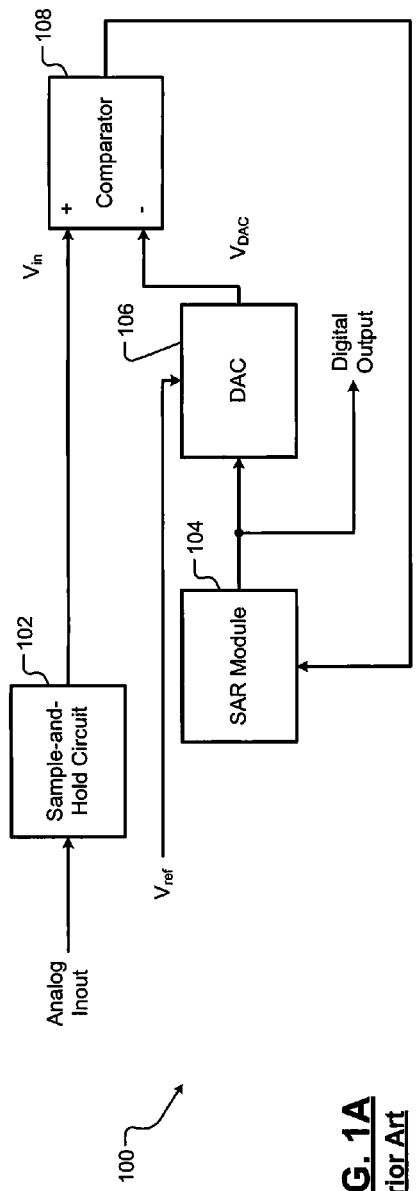
FIG. 1A depicts a successive-approximations-register analog-to-digital converter (SAR ADC)

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

In the successive-approximations-register analog-to-digital converter (SAR ADC), the signal swing at the input of the comparator during MSB testing is large. The large signal swing during MSB testing can cause a temporary shift in comparator offset, which may affect comparisons made by the comparator subsequent to the MSB testing. The large signal swing also makes it difficult to use ground as common mode voltage. Further, the large signal swing prevents use of a low power supply for the comparator.

The present disclosure relates to reducing the signal swing at the input of the comparator, thereby providing flexibility to reduce power supply levels for the comparator while maintaining maximum signal-to-noise ratio (SNR). Further, large overdrive recovery necessitated by a large signal swing at the input of the comparator can be avoided, thereby increasing conversion rate at low power levels.

Specifically, the present disclosure relates to reducing the signal swing at the input of the comparator as follows. A first part of the conversion is performed using a portion of sampled charge and lower-order DAC elements rather than the MSBs. In combination with an attenuation capacitor for direct sampling or a split input capacitor, this reduces the voltage swing for the initial comparisons. After first n bits are resolved, the MSBs of the DAC are loaded with the n bits, and the conversion continues normally with bit n−1. One redundant comparison is used to remove any errors that may occur in the first n comparisons.

Figure 3:
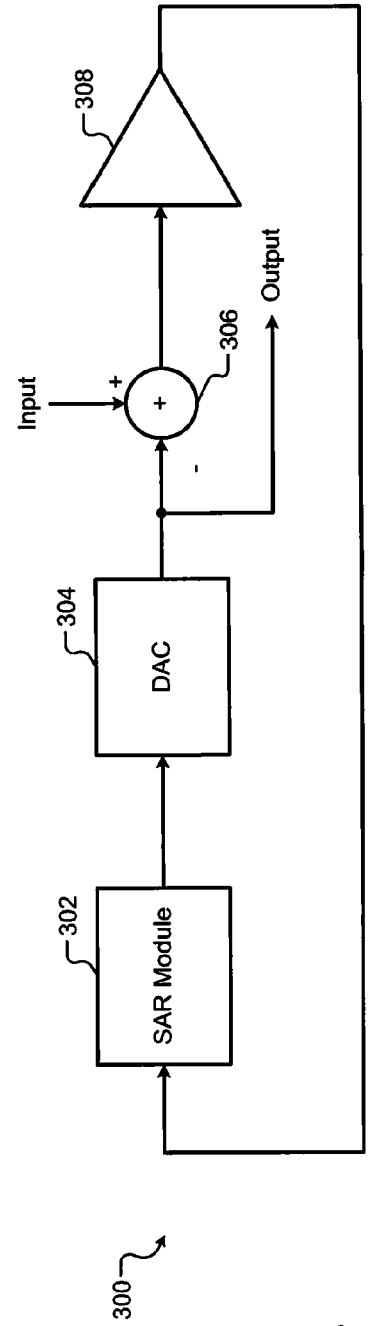
FIG. 3 is a functional block diagram of a SAR ADC.

Referring now to FIG. 3, a SAR ADC 300 includes a SAR module 302, a DAC 304, a summing module 306, and a comparator 308. The SAR module 302 outputs binary values to the DAC 304 according to the binary search algorithm. The DAC 304 generates outputs based on the binary inputs received from the SAR module 302. The summing module 306 receives the analog input and sums the analog input and the output generated by the DAC 304. The comparator 308 tests the result of the summing module 306 for polarity. For an n-bit ADC, n comparisons are made.

In SAR ADCs using a capacitive DAC, the capacitive DAC can be of two types: a direct sampling DAC, where DAC capacitors are used to sample the input signal, or a DAC that uses sampling capacitors that are separate from DAC capacitors.

Figure 4:
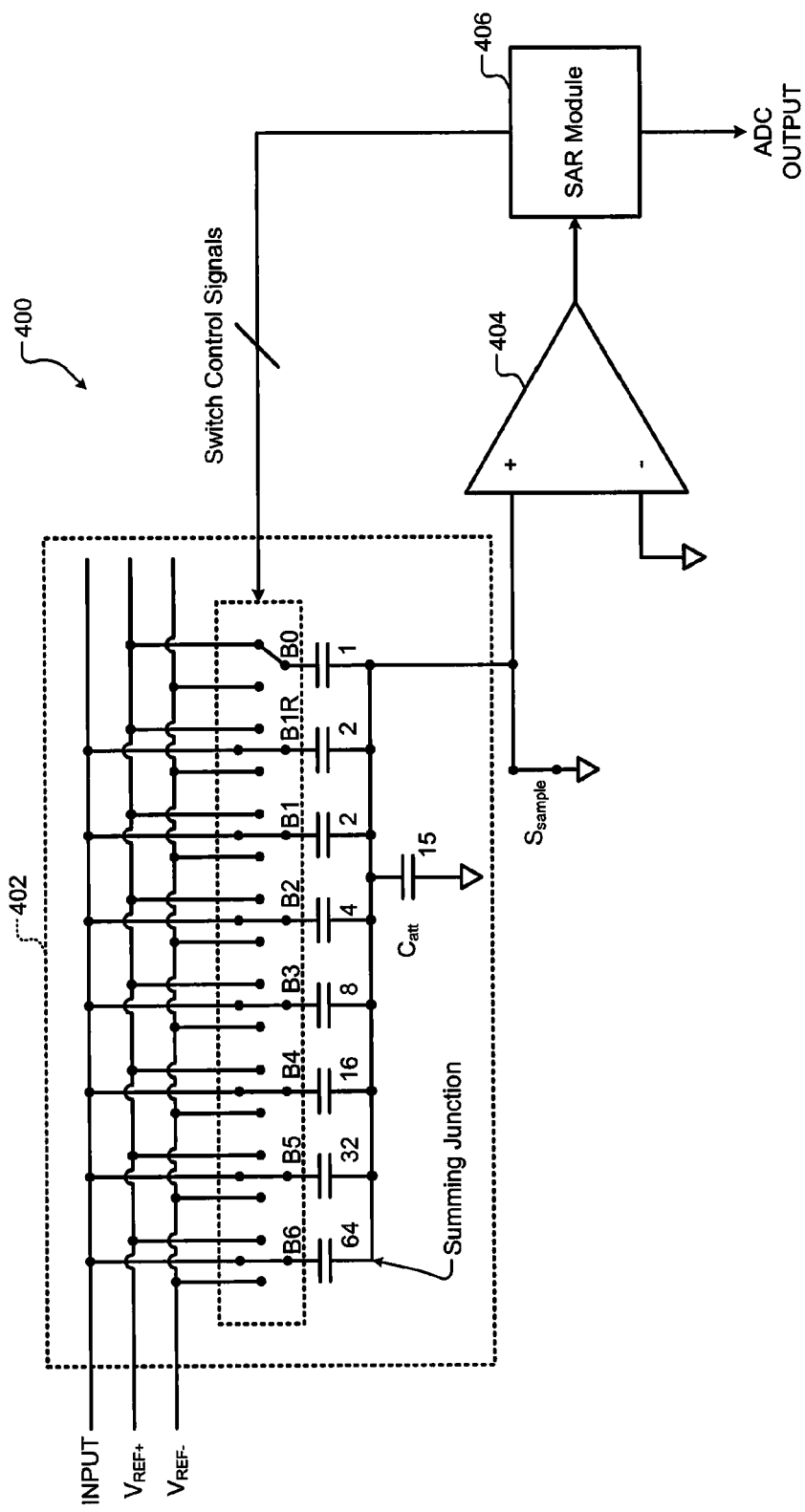
FIG. 4 is depicts a SAR ADC using a direct-sampling capacitive DAC.

Referring now to FIG. 4, a SAR ADC 400 using a direct sampling DAC 402 according to the present disclosure is shown. The SAR ADC 400 includes the direct sampling DAC 402, a comparator 404, and a SAR module 406. The DAC 402 is a direct sampling DAC since the DAC 402 includes multiple DAC capacitors that are used as sampling capacitors to sample the input signal. In other words, the DAC capacitors of the DAC 402 provide an already split sampling capacitor.

The sampling capacitors of the DAC 402 are binary weighted. One terminal of each sampling capacitor is connected to a summing junction. The other terminal of each sampling capacitor is connected to a switch. The switch connects the associated sampling capacitor to the input signal, a reference voltage $V_{REF+}$, or a reference voltage $V_{REF-}$ depending on control signals received from the SAR module 406. The summing junction is connected to the comparator 404 input as shown. A sampling switch $S_{sample}$ is added between the summing junction and ground.

An attenuation capacitor ($C_{att}$) is added between the summing junction and ground as shown. The value of the attenuation capacitor $C_{att}$ is selected as follows. For example, to reduce the swing at the summing junction by a factor of 8, for a 16-bit SAR ADC, the attenuation capacitor $C_{att}$ may have a value equivalent to, for example, $\frac{1}{16}^{th}$ of the sampling capacitor. After acquisition, the SAR module begins the comparison with the bit that is $\frac{1}{8}^{th}$ the size of the attenuation capacitor, or bit 9. The SAR module tests bits 9, 8 and 7. After bit 7, the SAR module switches all the sampling capacitors to the input signal and shifts the value stored on bits <9:7> in the SAR register to DAC bits <15:13>. The SAR module then completes the remaining trials from bit 12 and adds an extra comparison to recover from any errors.

In general, in the SAR ADC 400, after the input signal is sampled, switches connected to a selected number of the sampling capacitors are closed at the start of the comparison phase. For an m-bit DAC, during a first trial, the input signal is compared to DAC bit (m−n−1) instead of DAC bit (m−1). The SAR module 406 continues the binary search algorithm through to DAC bit (m−2n). Next, the DAC bits (m−n−1) to (m−2n) are reset and the DAC bits (m−1) to (m−n) are loaded with values that had been stored on DAC bits (m−n−1) to (m−2n) at the same time as closing the switches connected to the remaining sampling capacitors. An offset of $2^{(m-n-1)}$ is added and an extra comparison is performed at the level of $2^{(m-n)}$. The extra comparison allows the SAR ADC 400 to recover from errors as large as $2^{(m-n-1)}$. After completing the remaining comparisons, the offset is subtracted from the final result. This reduces the maximum swing at the comparator input by a factor of $2^n$.

In FIG. 4, for example, the DAC 402 is shown as a 7-bit direct sampling DAC. In the example shown, the SAR module 406 includes a 7-bit register, where bit B6 is the MSB, and bit B0 is the LSB. The DAC 402 includes sampling capacitors that are binary weighted for bits B6 through B0. The capacitor for bit B0 does not sample the input and connects to $V_{REF+}$ during sampling. The DAC 402 includes an additional capacitor for bit B1 (denoted as B1R), where the capacitors for bits B0 and B1R are used for a redundant trial to recover from any errors. When the conversion is complete, the SAR register outputs bits B6 through B0, which represent a digital value of the input signal.

During sampling, all the sampling capacitors except the capacitor for bit B0 (capacitor B0) sample the input signal. That is, the switches connected to the sampling capacitors except the capacitor B0 connect to the input signal, and the sampling switch $S_{sample}$ is closed. Conventionally, at the start of conversion following sampling, the sampling switch $S_{sample}$ opens, and all the sampling capacitors of the DAC 402 are disconnected from the input and then connect to either $V_{REF+}$ or $V_{REF-}$. According to the present disclosure, however, at the start of conversion, only sampling capacitors for bits B2, B1, B1R, and B0 are used. Specifically, sampling capacitor for bit B2 is connected to $V_{REF+}$, and sampling capacitors for bits B1 and B1R are connected to $V_{REF-}$ while sampling capacitor for bit B0 stays connected to $V_{REF+}$. Switches connected to sampling capacitors for bits B6 through to B3 are open. That is, sampling capacitors for bits B6 through to B3 are not connected to the input, $V_{REF+}$, or $V_{REF-}$.

In a conventional converter, a voltage at the summing junction can swing as much as $\pm V_{REF}/2$, where $V_{REF}=(V_{REF+}-V_{REF-})$. The maximum swing occurs when the input voltage is zero or full scale. According to the present disclosure, however, when the input voltage is zero, for example, the voltage at the summing junction can have a swing of $V_{REF}*(4/24)$, which is $1/3^{rd}$ the swing in the conventional converter. This is because 24 capacitors (capacitors for bits B2, B1, B1R, and B0, and $C_{att}$) are connected to the summing junction, and only 8 capacitors (capacitors for bits B2, B1, and B1R) sample the input signal.

During a comparison phase, using the binary search algorithm, the comparator 404 tests bit B2 during a first comparison, and bit B2 is kept or rejected based on results of the first comparison. Then bit B1 is tested during a second comparison, and bit B1 is kept or rejected based on results of the second comparison. During a third comparison, instead of testing bit B1R, the SAR module 406 loads values estimated by the B2 and B1 tests in bits B6 and B5 of the SAR register. Then bit B4 is tested by outputting the SAR register to the DAC 402. Since the 2 MSBs (i.e., B6 and B5) are already known and not tested, the signal at the comparator input is effectively attenuated by a factor of 4.

The comparisons continue to bit B1, and then the redundant trial is performed to recover from any errors. Specifically, bit B1R is set (i.e., capacitor for bit B1R is connected to $V_{REF+}$) at the same time as bit B0 is reset (i.e., capacitor for bit B0 is connected to $V_{REF-}$). Effectively, the redundant trial has a range of ±1LSB, and not 0 to 2LSB as in a conventional SAR ADC. Bit B0 is then tested normally, and the conversion is complete.

Thus, after testing bit B1, the output of the DAC 402 could change by either 0 or 1LSB. With the redundant trial, the output of the DAC 402 can change by −1 to 2LSB, allowing for an error of up to ±1LSB to have been made prior to that step. At the end of conversion, the SAR module 406 sums the result from B6 to B0 tests with the result from the redundant trial and the offset added at the redundant trial.

Alternatively, the signal at the input of the comparator can be attenuated in a conventional SAR ADC by using a larger attenuation capacitor than $C_{att}$. The larger attenuation capacitor, however, would use significant area. Additionally, due to the attenuated signal, the noise contributed by the comparator would be higher (e.g., 3 times higher) than the noise in the SAR ADC 400.

Figure 5A:
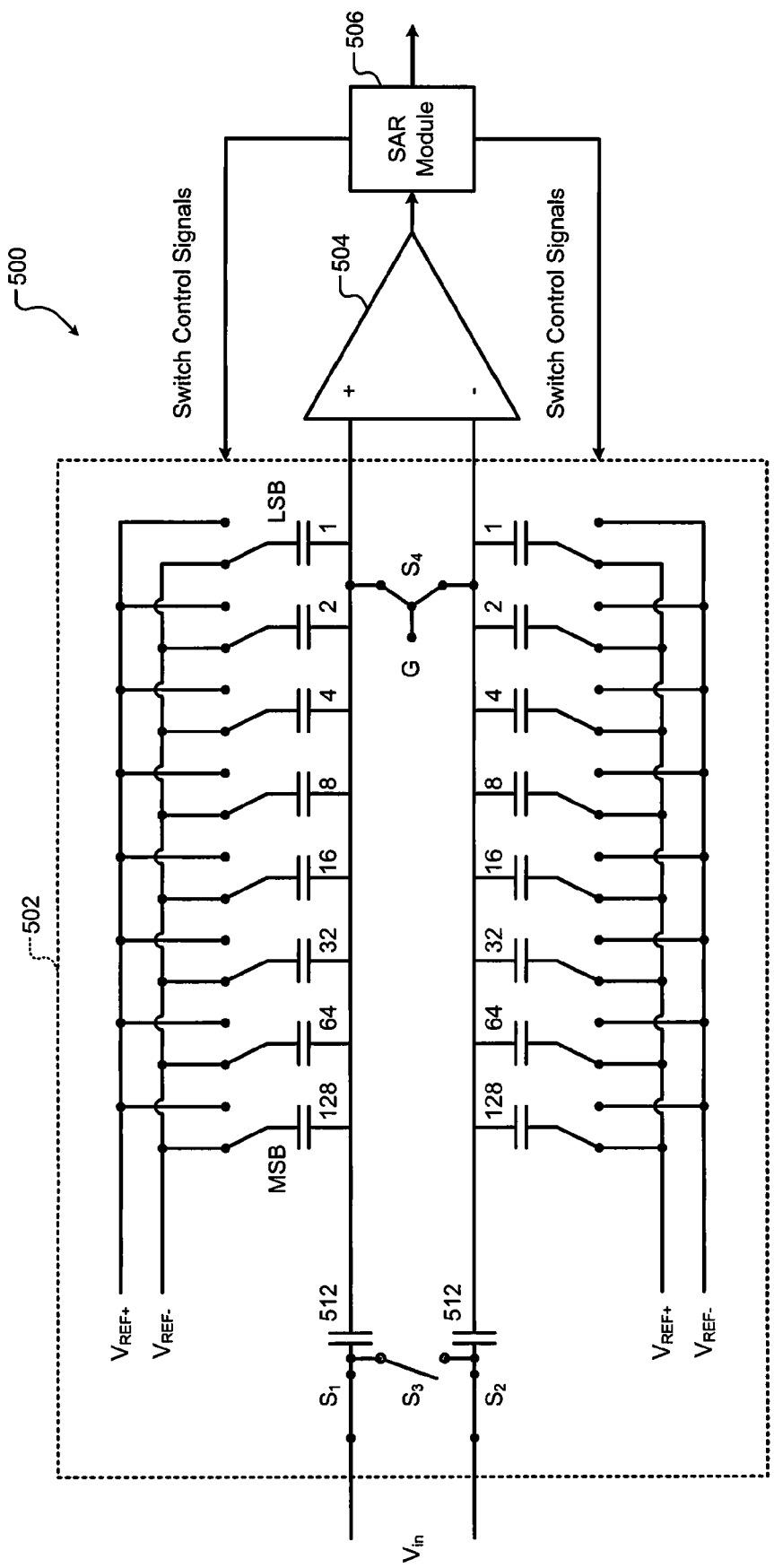
FIGS. 5A-5C depict a SAR ADC using two capacitive DAC arrays and a single sampling capacitor per DAC array.
Figure 5B:
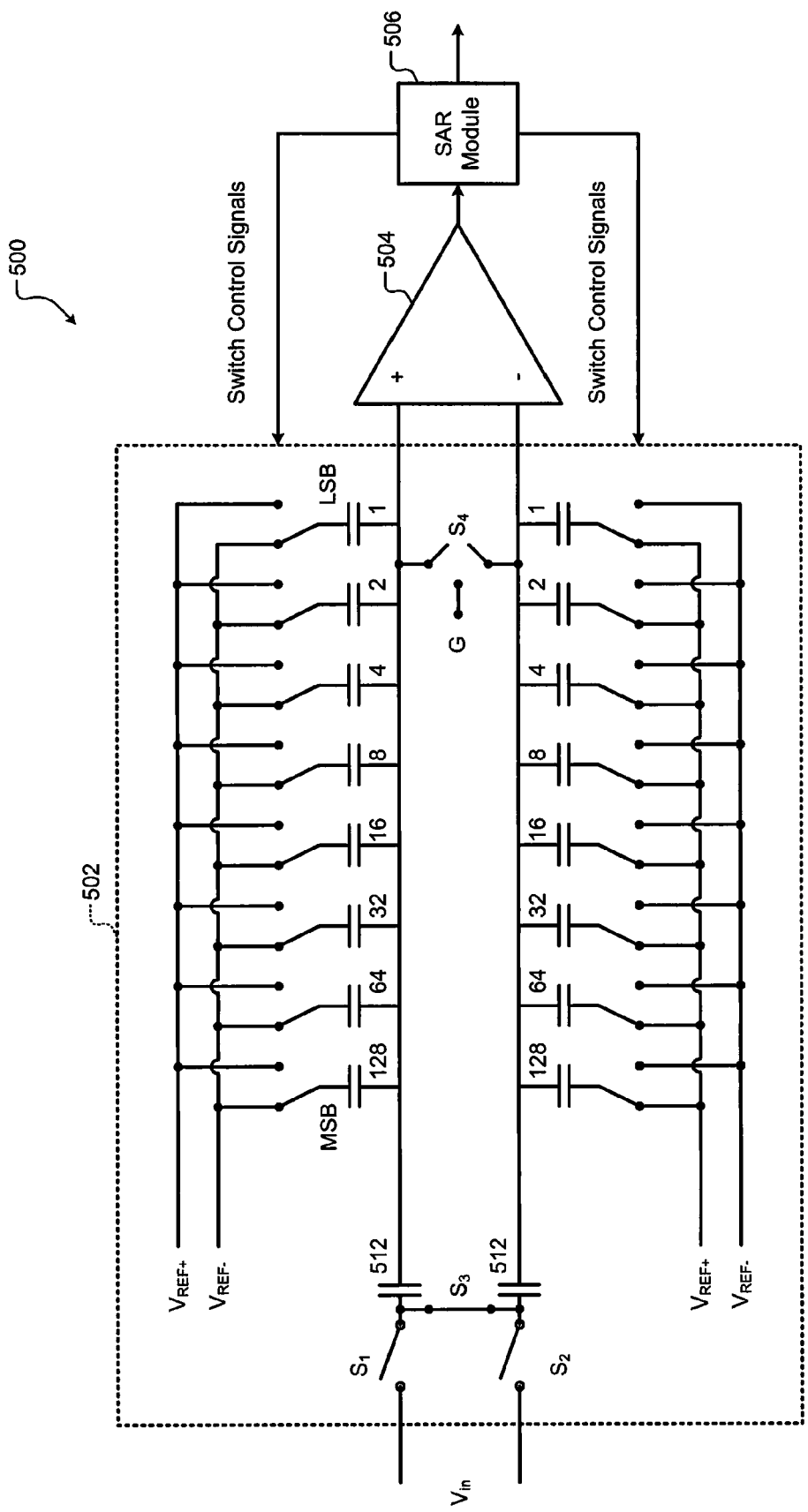
Figure 5C:
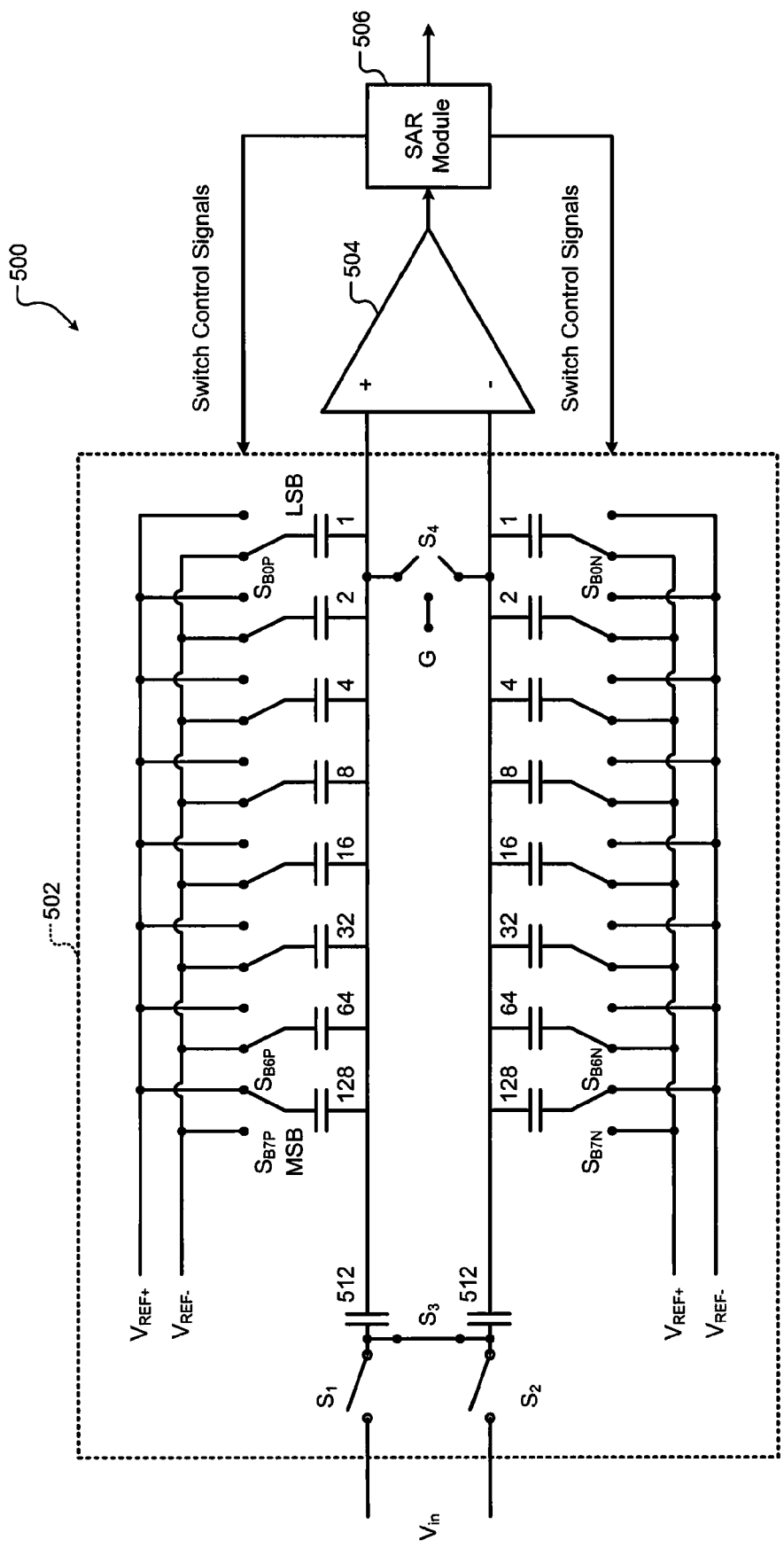

Referring now to FIGS. 5A-5C, a SAR ADC 500 comprising a non-direct sampling DAC 502, a comparator 504, and a SAR module 506 is shown. The DAC 502 includes two arrays of capacitors and switches. The two arrays are connected to two inputs of the comparator 504, respectively. Each array includes DAC capacitors that are binary weighted and that are connected to switches in series. The switches connect the DAC capacitors to $V_{REF+}$ or $V_{REF-}$. The components of two arrays may be distinguished by using letters P (as in positive) and N (as in Negative) depending on the positive and negative terminals of the comparator 504 to which the arrays are connected.

Each array is connected to a single input capacitor (i.e., a single sampling capacitor) that samples the input signal $V_{in}$ to be converted. The value of the sampling capacitor connected to an array is weighted in proportion to a sum of the values of the DAC capacitors in the array. The sampling capacitor may be larger or smaller than the sum of the values of the DAC capacitors in the array. The values of the sampling capacitors shown are for example only and can be different than the values shown. The values of the sampling capacitors determine the gain of the SAR ADC 500. The input signal $V_{in}$ is applied to the sampling capacitors of the arrays via switches S1 and S2 that are connected in series to the sampling capacitors as shown. Additionally, a switch S3 is connected across the sampling capacitors as shown. The SAR module 506 generates control signals that control the switches of the DAC 502 as follows.

In FIG. 5A, an acquisition mode of the SAR ADC 500 is shown. In the acquisition mode, switch S3 is opened; switches S1, S2 and S4 are closed; and the DAC 502 is reset. In FIG. 5B, end of acquisition mode is shown. At the end of the acquisition mode, switch S4 is initially opened. Thereafter, switches S1 and S2 are closed. Thereafter, switch S3 is closed. In FIG. 5C, MSB testing is shown. Switches S1, S2, S3, and S4 remain in the same positions as in FIG. 5B. Switches SB7P and SB7N are toggled as shown for MSB testing. Normally this step occurs at the same time as when switch S3 is closed at the end of the acquisition mode. However, this step is shown as a separate step for clarity. At the end of the MSB testing, the bit is either kept or rejected depending on the comparator output, and then the next bit is tested according to the binary search algorithm, and so on.

Figure 6A:
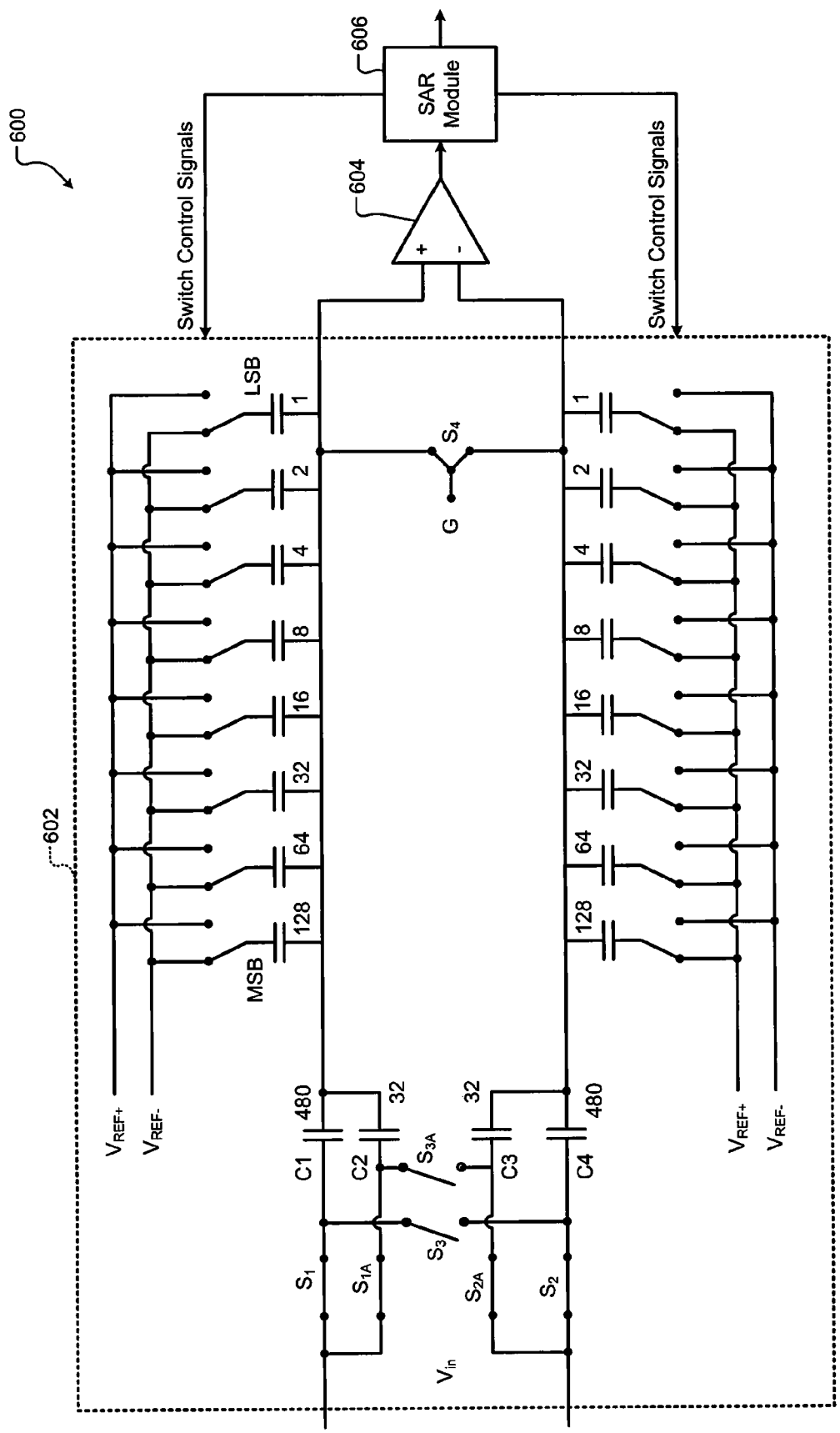
FIGS. 6A-6D depict a SAR ADC using two capacitive DAC arrays and split sampling capacitors per DAC array.
Figure 6B:
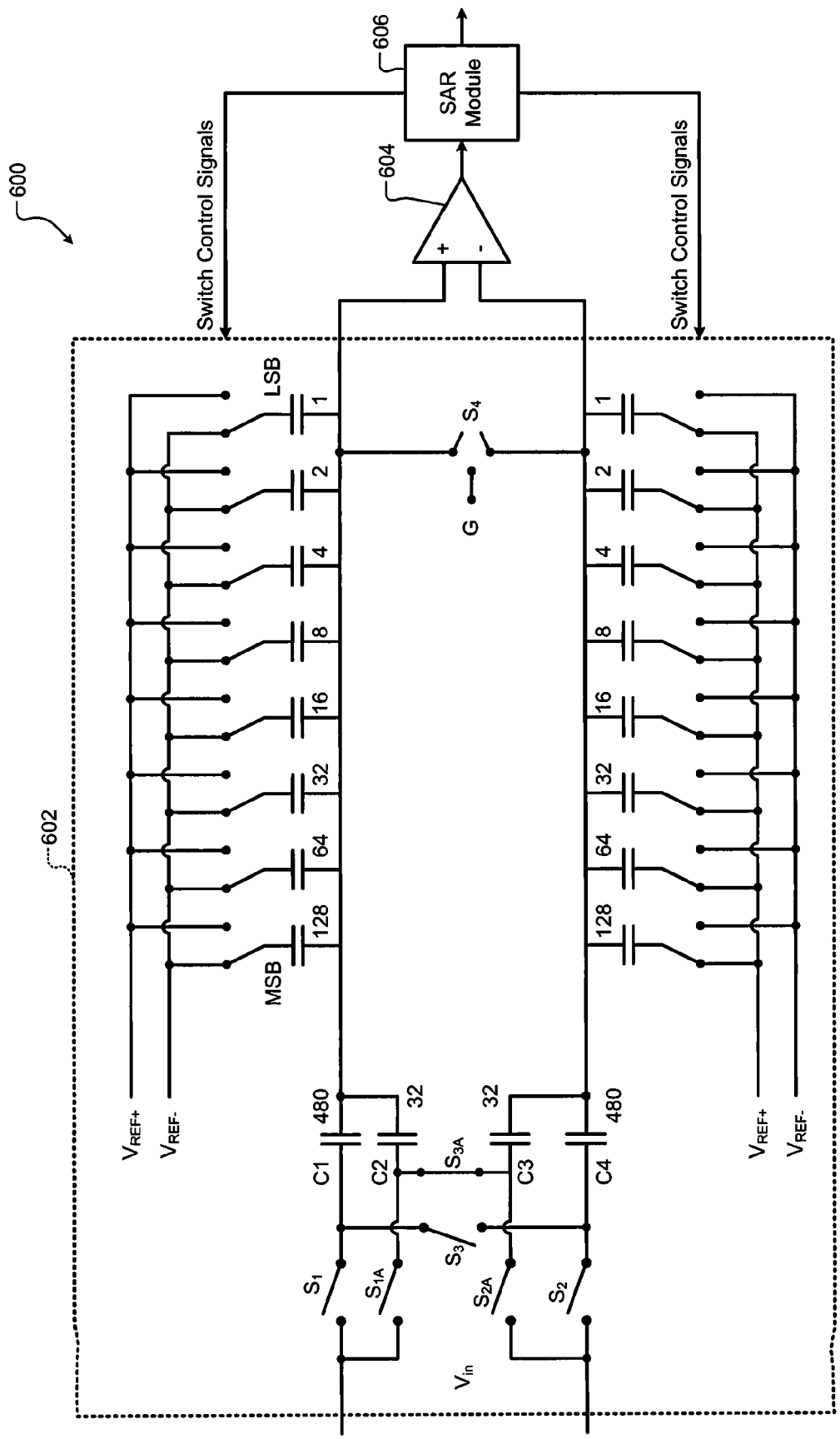
Figure 6C:
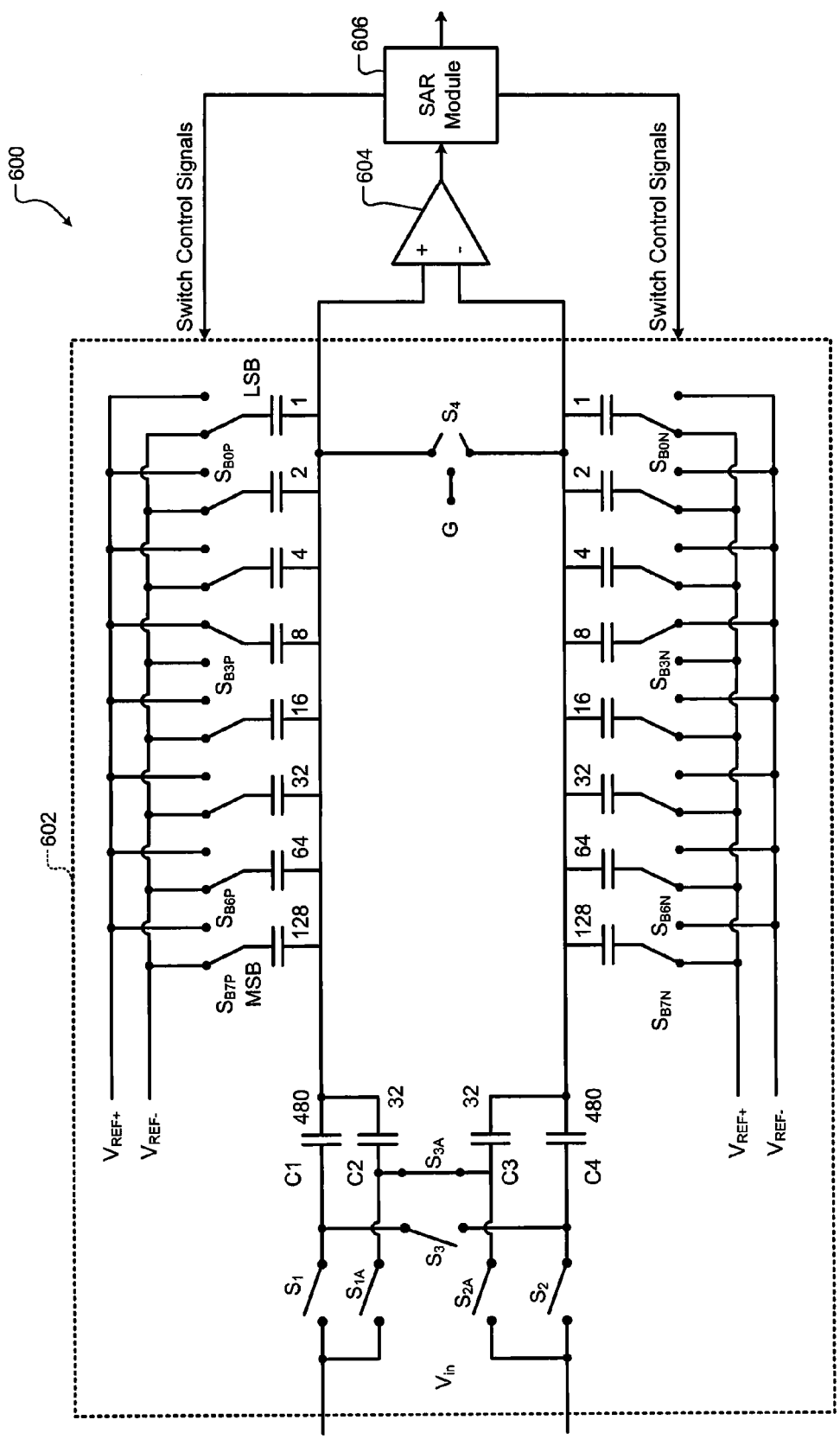
Figure 6D:
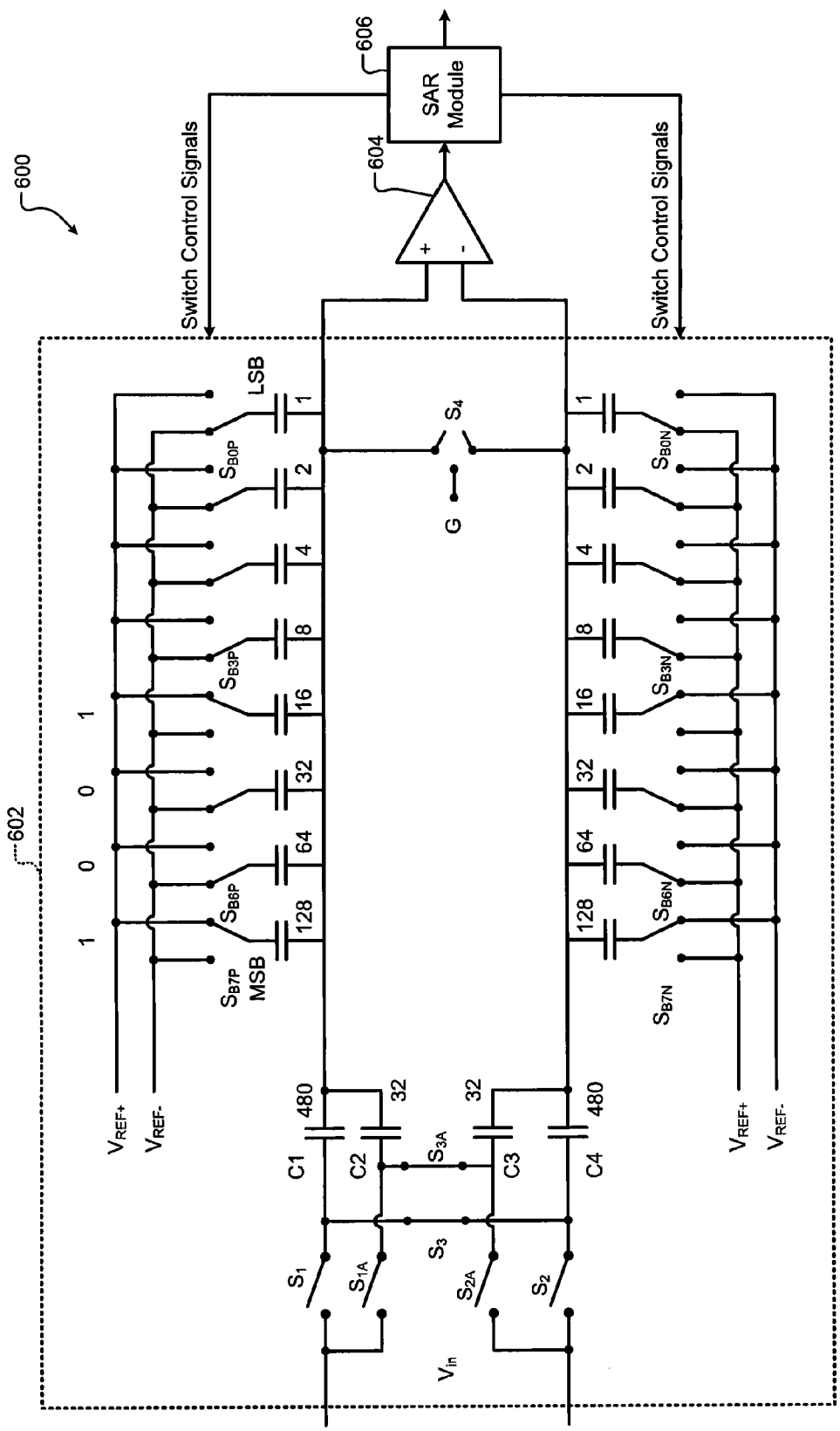
Figure 6E:
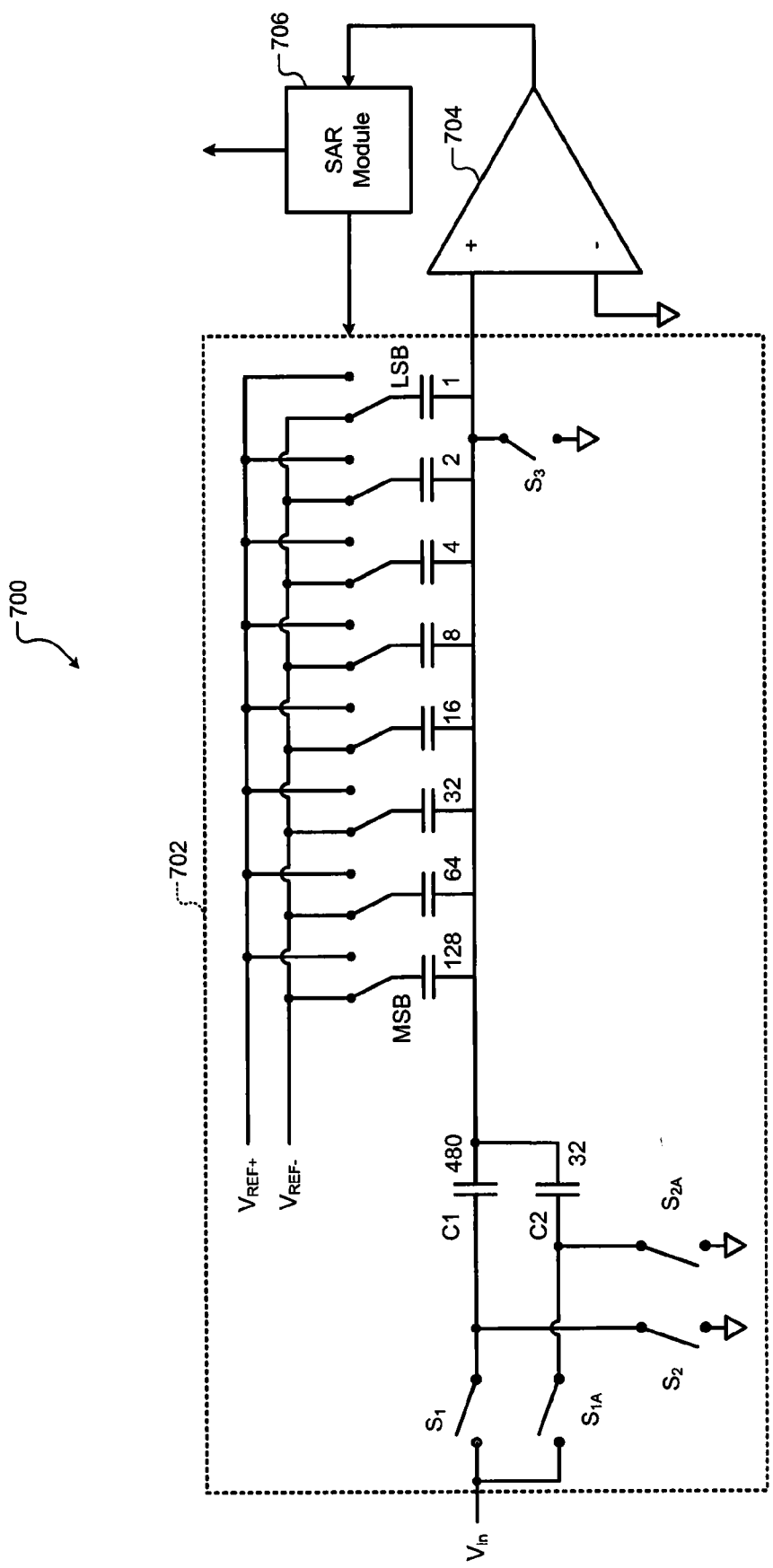
FIG. 6E depicts a SAR ADC using a single capacitive DAC array and split sampling capacitors.

Referring now to FIGS. 6A-6E, SAR ADCs comprising split sampling capacitors according to the present disclosure is shown. In FIGS. 6A-6E, a SAR ADC 600 comprising two capacitive arrays and a plurality of split sampling capacitors for each capacitive array according to the present disclosure is shown. In FIG. 6E, a SAR DAC 700 comprising a single capacitive array and a plurality of split sampling capacitors according to the present disclosure is shown.

In FIGS. 6A-6D, the SAR DAC 600 includes a DAC 602, a comparator 604, and a SAR module 606. The DAC 602 includes two arrays of capacitors and switches that are connected to two inputs of the comparator 604, respectively. Each array includes DAC capacitors that are binary weighted and that are connected to switches in series. The switches connect the DAC capacitors to $V_{REF+}$ or $V_{REF-}$. The components of two arrays may be distinguished by using letters P (as in positive) and N (as in Negative) depending on the positive and negative terminals of the comparator 604 to which the arrays are connected.

Each array is connected to a plurality of input capacitors (i.e., sampling capacitors) that sample the input signal $V_{in}$ to be converted. For example, the array connected to the positive input of the comparator 604 is connected to the sampling capacitors C1 and C2, and the array connected to the negative input of the comparator 604 is connected to the sampling capacitors C3 and C4. The sum of the sampling capacitors connected to an array is weighted in proportion to the sum of the DAC capacitors in the array. The sum of the sampling capacitors may be larger or smaller than the sum of the DAC capacitors in the array. The values of the sampling capacitors shown are for example only and can be different than the values shown. The values of the sampling capacitors determine the gain of the SAR ADC 600.

Each of the sampling capacitors C1 through C4 is connected to a switch S1, S1A, S2, and S2A, respectively. The input signal $V_{in}$ is applied to the sampling capacitors via the switches S1 through S2A according to control signals received from the SAR module 606. Additionally, a switch S3 is connected across the sampling capacitors C1 and C4, and a switch S3A is connected across the sampling capacitors C2 and C3 as shown. A switch S4 selectively connects a common terminal of the DAC capacitors in each array to ground. The SAR module 606 generates control signals that control the switches of the DAC 602 as follows.

In FIG. 6A, the acquisition mode of the SAR ADC 600 is shown. In acquisition mode, switches S1 through S2A and S4 are closed, and switches S3 and S3A are opened. In FIG. 6B, the end of the acquisition mode is shown. At the end of the acquisition mode, only switch S3A is closed, and S3 is held open. In FIG. 6C, the MSB test is shown. Instead of changing state of switches SB7P and SB7N as shown in FIG. 5C, the state of switches SB3P and SB3N is changed. Accordingly, the comparator 604 compares only $\frac{1}{16}^{th}$ of the charge, and therefore the signal at the input of the comparator 604 is attenuated by a factor of 16.

The conversion continues to bit 0 according to the binary search algorithm. Thereafter, the result is loaded into the DAC 602, and switch S3 is also closed to transfer the full charge from the input capacitors to the input of the comparator 604. For example, if the result for the first 4 bit tests is 1010, then the result is loaded into the DAC bits 7 to 4 as shown in FIG. 6D, and switch S3 closed. The conversion process then continues with bit 3 test, and so on until the conversion is complete. The extra DAC elements for the redundant trial are omitted for clarity.

In general, to reduce the maximum swing at the input of the comparator 604 by a factor of $2^n$, the sampling capacitor is split into $2^n$ equal units. The input is sampled on all the sampling capacitors. At the start of the comparison phase, charge from only one sampling capacitor is transferred to the input of the comparator 604. For an m-bit DAC, during a first comparison, the comparator 604 compares the input received from the sampling capacitor to DAC bit (m−n−1) instead of DAC bit (m−1). The SAR module 606 continues the binary search algorithm through to DAC bit (m−2n). Next, the SAR module 606 resets DAC bits (m−n−1) to (m−2n) and loads the DAC bits (m−1) to (m−n) with values that had been stored on DAC bits (m−n−1) to (m−2n) at the same time as closing the switches connected to the remaining sampling capacitors. An offset of $2^{(m-n-1)}$ is added and an extra comparison is performed at the level of $2^{(m-n-1)}$. The extra comparison allows the SAR ADC 600 to recover from errors as large as $2^{(m-n-1)}$.

After completing the remaining comparisons, the offset is subtracted from the final result, which represents the digital value of the input signal.

In FIG. 6E, the SAR DAC 700 includes a DAC 702 comprising a single DAC capacitive array, a comparator 704, and a SAR module 706. The array is connected to a first input of the comparator 704. The second input of the comparator 704 is connected to ground. The array includes DAC capacitors that are binary weighted and that are connected to switches in series. The switches connect the DAC capacitors to $V_{REF+}$ or $V_{REF-}$.

The array is connected to a plurality of input capacitors (i.e., sampling capacitors) that sample the input signal $V_{in}$ to be converted. For example, the array is connected to the sampling capacitors C1 and C2. The sum of the sampling capacitors C1 and C2 is weighted in proportion to the sum of the DAC capacitors in the array. The sum of the sampling capacitors may be larger or smaller than the sum of the DAC capacitors in the array. The values of the sampling capacitors shown are for example only and can be different than the values shown. The values of the sampling capacitors determine the gain of the SAR ADC 700. The sampling capacitors C1 and C2 are connected to switches S1 and S1A, respectively. The input signal $V_{in}$ is applied to the sampling capacitors C1 and C2 via the switches S1 and S1A according to control signals received from the SAR module 706. Additionally, a switch S2 is connected across the sampling capacitor C1 and ground, and a switch S2A is connected across the sampling capacitor C2 and ground as shown. A switch S3 selectively connects a common terminal of the DAC capacitors in the array to ground. The SAR module 706 generates control signals that control the switches of the DAC 702. The operation of the SAR ADC 700 is otherwise similar to the SAR ADC 600 and is therefore not described again.

The switches shown throughout the present disclosure may be implemented by semiconductor devices. The semiconductor devices may include metal-oxide semiconductor field-effect transistors (MOSFETs), for example. The SAR module shown throughout the present disclosure may include one or more of the switches and/or the comparator. The term "ground" used throughout the present disclosure denotes a reference voltage.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A successive-approximations-register analog-to-digital converter (SAR ADC) comprising:
    a digital-to-analog converter (DAC) including
        a first set of capacitors each having a first end connected to a common node, and a second end, and
        a first set of switches each connecting the second end of a respective one of the capacitors to a first reference voltage of the SAR ADC;
    a second set of capacitors each having a first end connected to the common node and a second end that receives an input to be converted by the SAR ADC when the common node is connected to a reference voltage; and
    a second set of switches that selectively connect the second end of a first capacitor of the second set of capacitors to the reference voltage when the input is disconnected from the second ends of the second set of capacitors and when the common node is disconnected from the reference voltage during a first of a plurality of successive approximations.

2. The SAR ADC of claim 1, wherein capacitances of the first set of capacitors are binary-weighted, the SAR ADC further comprising:
   a SAR module that switches connection of the second end of a second capacitor of the first set of capacitors from the first reference voltage to a second reference voltage of the SAR ADC during the first of the successive approximations, wherein a capacitance of the second capacitor is less than a highest and greater than a lowest of the binary-weighted capacitances; and
   a comparator having a first input connected to the common node, a second input connected to the reference voltage, and an output.

3. The SAR ADC of claim 2, wherein the SAR module sets the output of the comparator as a most significant bit of a digital value of the input, connects the second ends of the second set of capacitors to the reference voltage, and generates remaining bits of the digital value of the input by performing additional successive approximations.

4. The SAR ADC of claim 1, wherein:
   capacitances of the first and second sets of capacitors are binary-weighted, and
   the first capacitor of the second set of capacitors has a lowest of the binary-weighted capacitances in the second set of capacitors.

5. A successive-approximations-register analog-to-digital converter (SAR ADC) comprising:
   a digital-to-analog converter (DAC) including
      a first set of capacitors each having a first end connected to a first input of a comparator of the SAR ADC, and a second end,
      a first set of switches each connecting the second end of a respective one of the capacitors to a first reference voltage of the SAR ADC,
      a second set of capacitors each having a first end connected to a second input of the comparator, and a second end, and
      a second set of switches each connecting the second end of a respective one of the capacitors of the second set of capacitors to the first reference voltage;
   first, second, third, and fourth capacitors each having first ends that receive an input to be converted by the SAR ADC when the first and second inputs of the comparator are connected to a reference voltage, and second ends, wherein the second ends of the first and second capacitors are connected to the first input of the comparator and the second ends of the third and fourth capacitors are connected to the second input of the comparator; and
   a third set of switches that selectively connect the first end of the first capacitor to the first end of the third capacitor when the input is disconnected from the first ends of the first, second, third, and fourth capacitors and when the first and second inputs of the comparator are disconnected from the reference voltage during a first of a plurality of successive approximations.

6. The SAR ADC of claim 5, wherein capacitances of the first and second sets of capacitors are binary-weighted, the SAR ADC further comprising:
   a SAR module that switches connections of the second ends of (i) a fifth capacitor of the first set of capacitors and (ii) a sixth capacitor of the second set of capacitors from the first reference voltage to a second reference voltage of the SAR ADC during the first of the successive approximations, wherein a capacitance of the fifth and sixth capacitors is less than a highest and greater than a lowest of the binary-weighted capacitances; and
   the comparator that generates an output during the first of the successive approximations.

7. The SAR ADC of claim 6, wherein the SAR module sets the output of the comparator as a most significant bit of a digital value of the input, connects the first end of the second capacitor to the first end of the fourth capacitor, and generates remaining bits of the digital value of the input by performing additional successive approximations.

8. The SAR ADC of claim 5, wherein:
   capacitances of the first and second sets of capacitors and capacitances the first, second, third, and fourth capacitors are binary-weighted.

9. The SAR ADC of claim 5, wherein:
   the first and third capacitors have a first capacitance,
   the second and fourth capacitors have a second capacitance, and
   the first capacitance is less than or equal to the second capacitance.

10. A successive-approximations-register analog-to-digital converter (SAR ADC) comprising:
    a digital-to-analog converter (DAC) including
       a plurality of capacitors having binary-weighted capacitances, each having a first end connected to a common node, and a second end,
       a plurality of switches each connected to the second end of a respective one of the capacitors; and
    a SAR module that generates control signals to control the switches, wherein based on the control signals, the switches
       initially connect the second ends of the capacitors to an input to be converted by the SAR ADC when the common node is connected to a reference voltage,
       then, during a first of a plurality of successive approximations,
          disconnect the common node from the reference voltage,
          disconnect the second ends of the capacitors from the input, and
          connect the second end of one of the capacitors to a reference voltage of the SAR ADC,
          wherein a capacitance of the one of the capacitors is less than a highest and greater than a lowest of the binary-weighted capacitances; and
    a comparator having a first input connected to the common node and a second input connected to the reference voltage, wherein the comparator generates an output during the first of the successive approximations.

11. The SAR ADC of claim 10, wherein the SAR module sets the output of the comparator as a most significant bit of a digital value of the input and generates remaining bits of the digital value of the input by performing additional successive approximations.

12. The SAR ADC of claim 10, further comprising a capacitor having a first end connected to the common node and a second end connected to the reference voltage, wherein a value of the capacitor is a predetermined fraction of a sum of the binary-weighted capacitances.

* * * * *

UNITED STATES PATENT AND TRADEMARK OFFICE
CERTIFICATE OF CORRECTION

PATENT NO. : 8,441,386 B2  
APPLICATION NO. : 13/085920  
DATED : May 14, 2013  
INVENTOR(S) : Jonathan Ronald Francis Strode Page 1 of 2

Figure 1B:
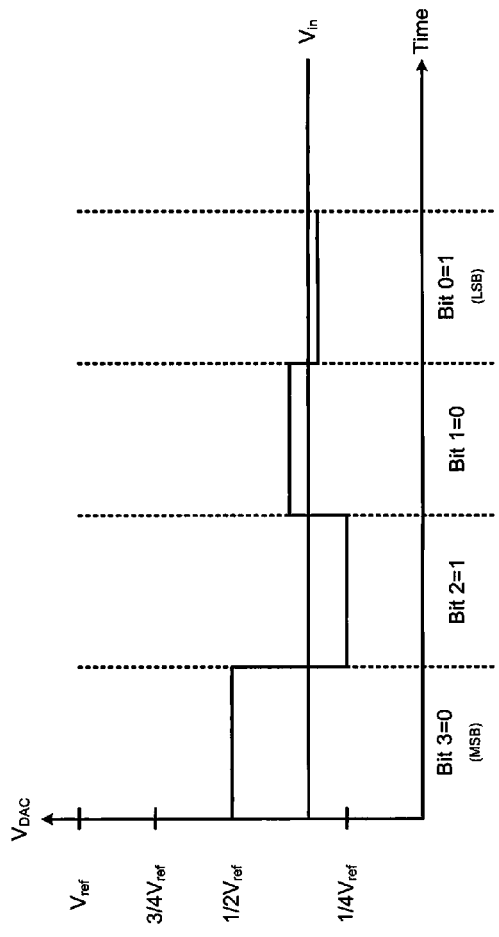
FIG. 1B shows an example of a 4-bit conversion performed by a SAR ADC using a binary search algorithm.
Figure 2:
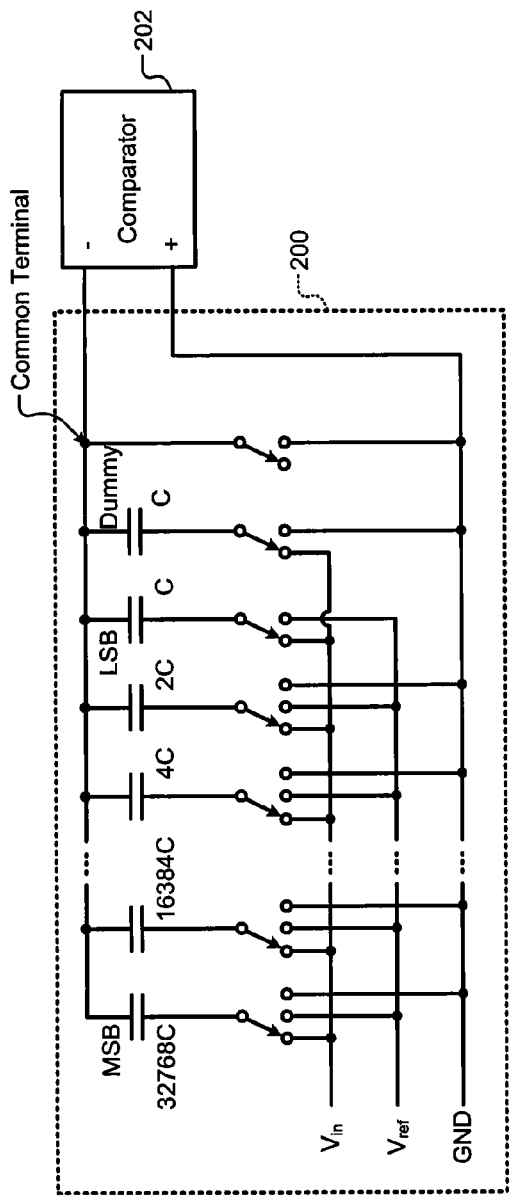
FIG. 2 depicts a SAR ADC using a capacitive DAC.

It is certified that error appears in the above-identified patent and that said Letters Patent is hereby corrected as shown below:

In the Drawings:
| | |
|---|---|
| Sheet 1 of 11, Fig. 1A, Prior Art | Delete "Inout" and insert --Input-- |
| Sheet 1 of 11, Fig. 1A, Prior Art | Delete "$V_{in}$" and insert --$V_{IN}$-- |
| Sheet 1 of 11, Fig. 1A, Prior Art | Delete "$V_{ref}$" and insert --$V_{REF}$-- |
| Sheet 1 of 11, Fig. 1B, Prior Art | Delete "$V_{ref}$" and insert --$V_{REF}$-- |
| Sheet 1 of 11, Fig. 1B, Prior Art | Delete "$3/4V_{ref}$" and insert --$3/4V_{REF}$-- |
| Sheet 1 of 11, Fig. 1B, Prior Art | Delete "$1/2V_{ref}$" and insert --$1/2V_{REF}$-- |
| Sheet 1 of 11, Fig. 1B, Prior Art | Delete "$V_{in}$" and insert --$V_{IN}$-- |
| Sheet 1 of 11, Fig. 1B, Prior Art | Delete "$1/4V_{ref}$" and insert --$1/4V_{REF}$-- |
| Sheet 2 of 11, Fig. 2, Prior Art | Delete "$V_{in}$" and insert --$V_{IN}$-- |
| Sheet 2 of 11, Fig. 2, Prior Art | Delete "$V_{ref}$" and insert --$V_{REF}$-- |

In the Specifications:
| | |
|---|---|
| Column 1, Line 53 | Delete "along" and insert --analog-- |
| Column 4, Line 5 | After "capacitances", insert --of-- |
| Column 7, Line 20 | Delete "connect" and insert --connected-- |
| Column 8, Line 21 | Delete "$V_{in}$" and insert --$V_{IN}$-- |
| Column 8, Line 29 | Delete "$V_{in}$" and insert --$V_{IN}$-- |
| Column 9, Line 5 | Delete "$V_{in}$" and insert --$V_{IN}$-- |
| Column 9, Line 19 | Delete "S2" and insert --S2A-- |
| Column 9, Line 19 | Delete "S2A" and insert --S2-- |
| Column 9, Line 20 | Delete "$V_{in}$" and insert --$V_{IN}$-- |
| Column 9, Line 21 | Delete "S2A" and insert --S2-- |
| Column 9, Line 67 | Delete "$2^{(m-n-1)}$" and insert --$2^{(m-n)}$-- |
| Column 10, Line 13 | Delete "$V_{in}$" and insert --$V_{IN}$-- |
| Column 10, Line 24 | Delete "$V_{in}$" and insert --$V_{IN}$-- |

In the Claims:
| | |
|---|---|
| Column 11, Line 31, Claim 5 | After "including", insert --:-- |

Signed and Sealed this  
Third Day of December, 2013

Margaret A. Focarino  
*Commissioner for Patents of the United States Patent and Trademark Office*

CERTIFICATE OF CORRECTION (continued)
U.S. Pat. No. 8,441,386 B2

| | |
|---|---|
| Column 12, Line 16, Claim 8 | After "capacitances", insert --of-- |
| Column 12, Line 26, Claim 10 | After "including", insert --:-- |